United States Patent [19]
Dalton

[11] 4,109,182
[45] Aug. 22, 1978

[54] DELAYED SWEEP SYSTEM FOR AN OSCILLOSCOPE

[75] Inventor: Oliver Dalton, Portland, Oreg.

[73] Assignee: Tektronix, Inc., Beaverton, Oreg.

[21] Appl. No.: 665,645

[22] Filed: Mar. 10, 1976

Related U.S. Application Data

[63] Continuation-in-part of Ser. No. 532,089, Dec. 12, 1974.

[51] Int. Cl.² ............................................. G01R 13/28
[52] U.S. Cl. ..................................... 315/392; 324/185
[58] Field of Search ............... 315/391, 393, 395, 399, 315/377; 324/121 R, 185

[56] References Cited

U.S. PATENT DOCUMENTS 3,975,684  8/1976  Mordan .................................. 324/185

*Primary Examiner*—Maynard R. Wilbur
*Assistant Examiner*—T. M. Blum
*Attorney, Agent, or Firm*—George T. Noe

[57] ABSTRACT

An improved delayed sweep system is disclosed for an oscilloscope having main and delayed sweeps. A trigger pickoff circuit has means for providing a pair of preselected trigger pickoff points on the delaying sweep so that delayed sweeps may be generated in accordance with the two points selected. An alternating display mode facilitates presentation of the delaying sweep and both delayed sweeps in a single display, with the relative time positions of both delayed sweeps appearing on the delaying sweep as a pair of intensified zones. Either delay time measurement between the sweep start and a point of interest on the display, or differential time measurement between two points of interest on the display may be made. Voltages proportional to the selected time measurement may be applied to a properly scaled digital voltmeter to provide a direct readout in units of time.

4 Claims, 6 Drawing Figures

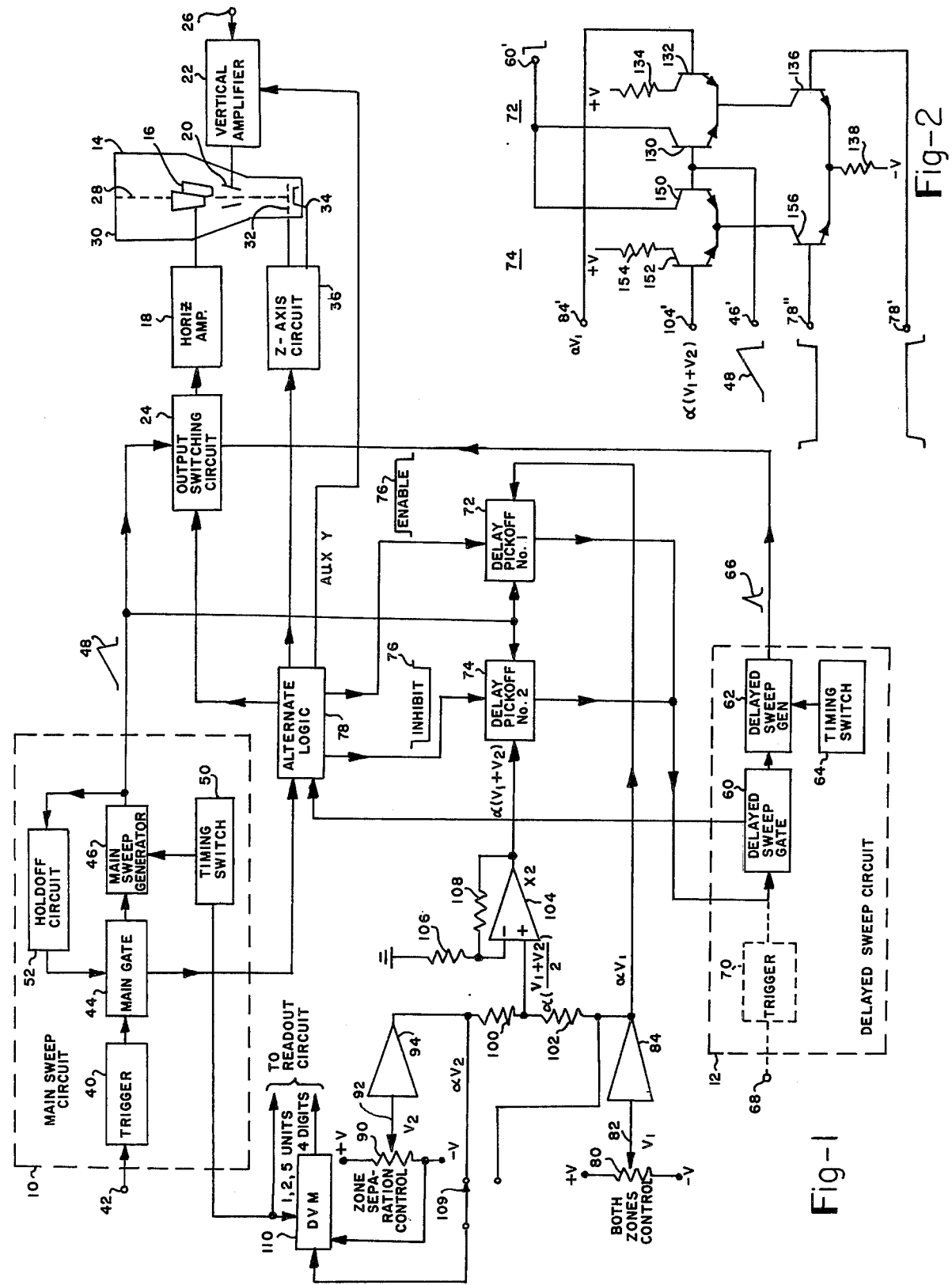

DELAYED SWEEP SYSTEM FOR AN OSCILLOSCOPE

CROSS-REFERENCE TO RELATED APPLICATION

This application is a continuation-in-part of U.S. Pat. Application Ser. No. 532,089 filed Dec. 12, 1974.

BACKGROUND OF THE INVENTION

In dual sweep oscilloscopes having delaying and delayed sweeps, the delaying sweep, hereinafter referred to as main sweep, is triggered either automatically or by some electrical event, and an unblanking gate waveform and a sweep sawtooth waveform are simultaneously produced to respectively turn on the electron beam in a cathode-ray tube and sweep the electron beam across the face of the cathode-ray tube at a linear rate to provide a visual display. The main sweep sawtooth is applied to a trigger pickoff circuit to generate a triggering signal to initiate the delayed sweep.

The trigger pickoff circuit usually includes a comparator having a pair of input terminals to which an adjustable reference voltage level and the linearly rising delaying sweep sawtooth voltage are applied. It is a common practice to utilize a linear 10-turn potentiometer called a Delay Time Multiplier to provide the adjustable reference voltage for the comparator, and the Delay Time Multiplier usually has a readout dial which is calibrated to the overall amplitude of the main sweep sawtooth so that a reading is provided which is indicative of the time difference between the start of the main sweep and the point at which the delayed sweep is triggered, such as is disclosed in U.S. Pat. No. 3,551,733.

When the delayed sweep is initiated, a sweep sawtooth waveform and an unblanking gate waveform are generated in essentially the same manner as for the main sweep to provide a delayed sweep display.

Typical operation of a dual-sweep oscilloscope is as follows: In a main sweep mode, an electrical phenomenon is observed in the waveform display, which the observer wishes to examine in closer detail. An intensified mode is selected whereby the unblanking gates of the main and delayed sweeps are algebraically added together so that the main sweep appears at normal intensity and the relative time position of the delayed sweep appears as a brightened segment or zone upon the main sweep display. By turning the Delay Time Multiplier dial, the observer can move the intensified segment to select the triggering point of the delayed sweep at any point over the length of the main sweep. The length of the intensified segment can be expanded or contracted by changing the sweep rate of the delayed sweep. After the observer has intensified the particular phenomenon he wishes to examine and selected suitable sweep rates, the delayed sweep display mode is then selected and the chosen phenomenon observed thereon.

The accuracy of the time interval measurement of the aforementioned prior art system is dependent upon several variables, for example, mainsweep linearity, Delay Time Multiplier potentiometer linearity, dial resolution and graticule interpretation. The flexibility of such a system is subject to human error and is extremely limited since the time interval measurement can be taken only with respect to the start of the main sweep.

One attempt to increase flexibility of time interval measurements was the two-dot indicator system disclosed in U.S. Pat. No. 3,881,133. This system included two controls, one for moving both dots on the main sweep and the other for controlling the separation between the dots. Thus time interval measurements could be made between any two points of interest on a main sweep display rather than only between the sweep start and a single point of interest.

SUMMARY OF THE INVENTION

According to the present invention, an improved delayed sweep system is provided in a dual sweep oscilloscope having conventional main and delayed time-base generators in which two intensified zones of interest on a main sweep may be examined. Delayed sweeps may be provided for each intensified zone by utilizing an alternating sweep sequence, and accurate time interval measurements are facilitated by a digital readout.

The trigger pickoff circuit which provides the triggering to initiate the delayed sweep preferably comprises first and second voltage comparators to which the main sweep sawtooth voltage is applied. Suitable first and second reference voltage generating means produce adjustable reference levels for the respective comparators so that when the main sweep sawtooth voltage passes through the selected reference levels the respective comparators switch and thereby generate an output signal which may trigger the delayed sweep. The reference voltage generating means are connected in tandem so that when the first voltage generating means is adjusted, both reference levels are adjusted equally and simultaneously, and when the second voltage generating means is adjusted the second reference level is adjusted with respect to the first level. A digital voltmeter which is calibrated and scaled in accordance with the main sweep provides a direct reading of the time intervals between the start of the main sweep and one selected point or between two selected points by measuring either the first reference voltage or the difference between the first and second reference voltages.

An alternating display mode facilitates presentation of the main sweep and both delayed sweeps in a single display with the relative time positions of both delayed sweeps appearing on the main sweep as a pair of intensified zones. An alternate logic circuit receives gating signals from both the main and delayed sweeps and establishes a suitable sequence for applying the sweep generator outputs (the sawtooth deflection signals and associated unblanking gate signals) to the cathode-ray tube.

It is therefore one object of the present invention to provide an improved delayed sweep system having higher accuracy in time difference measurements.

It is another object of the present invention to provide a direct readout of time difference between two displayed events.

It is a further object of the present invention to provide a clearer presentation of waveforms for which timing measurements are required.

It is yet another object of the present invention to magnify two separate portions of a sweep, and to display the magnified events simultaneously with the reference sweep upon which the magnified events are indicated by intensified segments.

It is yet a further object of the present invention to provide a direct readout of either delay time or differential time measurements.

Other objects and attainments of the present invention will become apparent to those skilled in the art upon a reading of the following detailed description when taken in conjunction with the drawings in which there is shown and described a block diagram and an illustrative embodiment of the invention. It is to be understood, however, that this embodiment is not intended to be exhaustive nor limiting of the invention but is given for purposes of illustration in order that others skilled in the art may fully understand the invention and principles thereof and the manner of applying it in practical use so that they modify it in various forms, each as may be best suited to the conditions of the particular use.

DRAWINGS

FIG. 1 is a detailed block diagram of an improved delayed sweep system according to the present invention;

FIG. 2 is a detailed schematic diagram of the delay pickoff circuits;

DETAILED DESCRIPTION

Figure 3:
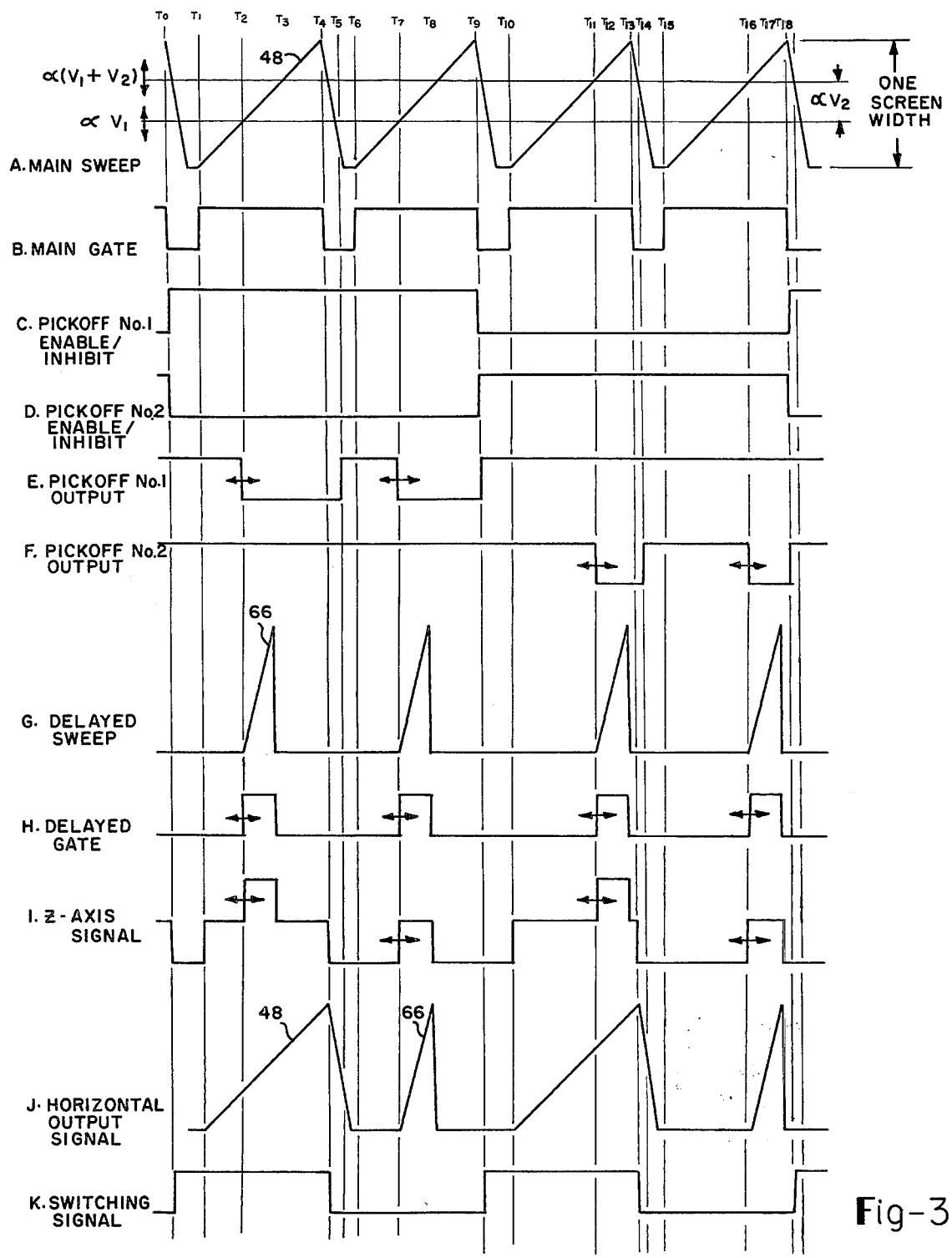
FIG. 3 is a chart of waveforms illustrating operation of the present invention.

Referring to FIG. 1, an improved delayed sweep system comprises a main or delaying sweep circuit 10 and a delayed sweep circuit 12 forming portions of an oscilloscope also provided with a cathode-ray tube 14. Cathode-ray tube 14 has horizontal deflection plates 16 driven by horizontal amplifier 18, and vertical deflection plates 20 driven by vertical amplifier 22. The horizontal amplifier 18 receives its input from switching circuit 24, which selects between the outputs of the main and delayed sweep circuits 10 and 12 respectively. An input signal waveform to be displayed is appropriately applied at terminal 26 comprising the input of the vertical amplifier 22 whereby electron beam 28 is caused to move vertically across cathode-ray tube screen 30, as horizontal deflection plates 16 cause the electron beam to move horizontally across screen 30 for providing a time base sweep in the usual manner.

Cathode-ray tube 14 also includes a control grid 32 and a cathode 34 connected to Z-axis circuit 36 for controlling the biasing conditions of the cathode and grid in order that electron beam 28 is generated at certain times and blanked at other times. For example, the electron beam is turned off or blanked during the retrace interval between time base sweeps.

The main sweep circuit 10 includes a trigger circuit 40 receiving a trigger input at terminal 42, which may be derived via a suitable trigger pickoff from the input signal. Trigger circuit 40 may suitably include a voltage-level comparator and a waveform slope selector, as is common and well established in the oscillography art. At a selectable point on the input waveform a trigger signal is generated by trigger circuit 40 and applied to the main sweep gate 44, which may suitably be a multivibrator or a digital logic gating circuit. The main sweep gate 44 produces a gate signal to turn on the main sweep generator 46, and the gate signal is also routed to the Z-axis circuit 36 to turn on the electron beam 28, as will be discussed later. The main sweep generator 44 typically comprises a Miller integrator having a timing circuit or time constant circuit such as a capacitor and resistor combination and produces a linear ramp voltage waveform 48.

A timing switch 50 permits selection of the capacitor and resistor values so as to change the sweep rate, that is, the slope and duration of the waveform 48. The waveform 48 has a duration equal to one width of the screen 30, so that screen 30 may be scribed in a precise grid pattern to facilitate graphical analysis of a displayed waveform. The timing switch 50, then, permits selection of sweep rates calibrated in units of time per grid division to provide a wide range of timing choices.

When the ramp waveform 48 reaches a specified value, the main sweep gate 44 reverts to its original state and the ramp terminates in the usual manner. At the conclusion of the ramp waveform 48 produced by main sweep generator 46 hold-off circuit 52 is activated to prevent triggering of main gate 44 until circuits of the sweep generator 10 have completely recovered to their original predetermined levels. Holdoff circuit 52 may suitably comprise an astable multivibrator having an unstable state whose period is determined by a selectable capacitor ganged to the timing switch 50.

The hereinabove described main sweep circuit 10 is well known in the art, and examples thereof may be found in U.S. Pat. No. 2,769,904, U.S. Pat. No. 2,769,905, U.S. Pat. No. 3,215,948, and U.S. Pat. No. Re 26,333.

The delayed sweep generator circuit 12 includes a delayed sweep gate 60, a delayed sweep generator 62, and a timing switch 64, which are the same types of circuits and operate in substantially the same manner as the corresponding circuits of the main sweep generator 10. According to the preferred mode of operation of the present invention, the delayed sweep gate 60 is activated in response to a switching signal from the delay pickoff circuitry, which will be discussed in subsequent paragraphs, and the delayed sweep generator 62 is turned on to produce a linear ramp voltage waveform 66 whose rate is determined by timing switch 64. The delayed sweep circuit may be operated in response to a triggering signal applied to input terminal 68 for independent dual sweep operation, in which case a trigger circuit 70, shown in phantom, and identical to trigger circuit 40, would be required. An appropriate mode switch would permit selection of the signal source from which the delayed sweep gate 60 is activated.

The delay pickoff portion of FIG. 1 includes a first delay pickoff circuit 72 and a second delay pickoff circuit 74, which are alternately enabled and inhibited by signals 76 generated by the alternate logic circuit 78. The alternate logic circuit 78 receives the main sweep gating signal at one input thereof, and counts it down by a factor of four in producing the inhibit-enable signal 76. For example, the enable portion of the signal 76 is applied to the first delay pickoff circuit 72 for two sweep periods while the second delay pickoff circuit 74 is inhibited, then the inhibit portion of the signal 76 is applied to first delay pickoff circuit 72 for two sweep periods while second delay pickoff circuit 74 is enabled. The reason for this, as will be apparent later is to establish an alternating display between the main sweep and a pair of delayed sweeps. The alternate logic circuit also utilizes the main sweep gate to derive a switching signal to be applied to output switching circuit 24 to facilitate passage therethrough of either main sweep waveform 48 or delayed sweep waveform 66 to be applied to the horizontal amplifier 18. Two additional functions of the alternate logic circuit are to develop unblanking signals derived from the main and delayed sweep gates to be applied to the Z-axis circuit 36, and to produce an auxiliary Y-axis voltage coincident with each main sweep and with every other delayed sweep to provide vertical separation of the main and delayed sweep displays. The alternate logic circuit 78 will be described in detail after a complete discussion of the delay pickoff circuitry.

The first delay pickoff circuit 72 and second delay pickoff circuit 74 simultaneously receive the ramp waveform 48 from the main sweep generator 46 and compares same to a pair of adjustable reference voltage levels, $\alpha V_1$ and $\alpha(V_1 + V_2)$ to produce an output signal in response thereto when the ramp waveform 48 passes through the reference level. The output signal so produced is applied to the delayed sweep gate circuit 60 to initiate the delayed sweep ramp waveform 66. As mentioned above, only one delay pickoff circuit is enabled at a time, so only one delayed sweep is initiated during a main sweep interval.

The adjustable reference levels are generated as follows: A first potentiometer 80 is connected between a pair of suitable voltages, $+V$ and $-V$, to develop a voltage thereacross. A wiper arm 82 selects a voltage $V_1$ and applies it to amplifier 84 to produce a voltage $\alpha V_1$ at the output thereof which is proportional to $V_1$. The adjustable range of $\alpha V_1$ is preferably from the minimum value of waveform 48 to the maximum value thereof so that a voltage comparison may be made at any point on the waveform 48. Similarly, a second potentiometer 90 connected between $+V$ and $-V$ and having a wiper arm 92 provides a selectable voltage $V_2$ which is applied to amplifier 94 to produce a voltage $\alpha V_2$ at the output thereof which is proportional to $V_2$. The gains of operational amplifiers 84 and 94 preferably have identical gain characteristics so that for corresponding points across potentiometers 80 and 90, $\alpha V_1 = \alpha V_2$.

A pair of resistors 100 and 102 having equal resistance values are serially connected between the outputs of operational amplifiers 84 and 94 so that a voltage having a value $(\alpha_{\frac{1}{2}}V_1 + \alpha_{\frac{1}{2}}V_2)$ appears at the junction thereof and is applied to an operational amplifier 104, having a pair feedback resistors 106 and 108 having equal values to provide a gain of 2 to the output thereof to produce the reference voltage $\alpha(V_1 + V_2)$.

From the foregoing description, it can be appreciated that adjustment of potentiometer 80 effects an equal adjustment of both reference levels $\alpha V_1$ and $\alpha(V_1 + V_2)$, while adjustment of potentiometer 90 effects reference level $\alpha(V_1 + V_2)$ only. For this reason, potentiometer 80 may be called a "Both Zones Control," and potentiometer 90 may be called a "Zone Separation Control". Further, since waveform 48 is a linear ramp to provide a linear time base, the difference $\alpha V_2$ is directly proportional to the time difference between the waveform 48 passes through the two reference levels. The voltages $\alpha V_1$ and $\alpha V_2$ may be applied selctively via switch 109 to a digital voltmeter 110, which can provide a direct readout on any suitable indicating means such as light-emitting diodes or a cathode-ray tube character readout. The voltage $\alpha V_1$ corresponds to the delay time interval between the start of the main sweep and the first delay pickoff point thereon, and the voltage $\alpha V_2$ corresponds to the differential time interval between the first and second delay pickoff points on the main sweep waveform. Switch 109 may be ganged with a second switch connected to alternate logic circuit 78 to disable the second delay pickoff comparator 74 to provide a conventional delayed sweep mode. The digital voltmeter 110 may receive scaling information from the main sweep timing switch 50 to ensure that the time scale of the readout corresponds to the sweep rate.

The details of the delay pickoff circuits 72 and 74 are shown in FIG. 2. Delay pickoff circuit 72 comprises transistors 130 and 132 connected as a voltage comparator. The collector of transistor 132 is connected through a load resistor 134 to a suitable D.C. power supply voltage $+V$, while the collector of transistor 130 is connected to an output terminal 60', which is connected to the delayed sweep gate circuit previously discussed. The common emitters of transistors 130 and 132 are connected to a collector of transistor 136, whose emitter is connected through a resistor 138 to a source of negative DC voltage $-V$. The base of transistor 136 is connected to an input terminal 78', which is one output of the previously mentioned alternate logic circuit. Similarly, delay pickoff circuit 74 comprises a pair of transistors 150 and 152 connected as a voltage comparator. The collector of transistor 152 is connected to a suitable source of positive DC voltage $+V$ through a load resistor 154, while the collector of 150 is connected to the output terminal 60'. The common emitters of transistors 150 and 152 are connected to the collector of transistor 156, whose emitter is connected through resistor 138 to the source of negative DC voltage $-V$. The base of transistor 156 is connected to an input terminal 78", which is connected to receive an output of alternate logic circuit which is complementary to the output received at terminal 78'.

The bases of transistors 130 and 150 are connected together and to an input terminal 46', which receives the main sweep waveform 48. The bases of transistors 132 and 152 are connected respectively to input terminal 84' and 104' to which the reference voltages $\alpha V_1$ and $\alpha(V_1 + V_2)$ are applied.

One complete cycle of the delay pickoff circuits and delayed sweep generation will now be described in connection with the waveforms shown in FIG. 3. The major events of the cycle are shown as time $T_0$ to $T_{18}$. Prior to time $T_0$, constant-current source transistor 136 is cut off by the negative voltage applied to terminal 78', and constant-current source transistor 156 is conducting because of the positive voltage at terminal 78". With no current source at the emitter thereof, transistors 130 and 132 are off. The base of transistor 152 having a voltage $\alpha(V_1 + V_2)$ applied thereto, is positive with respect to the base of transistor 150, to which $V_0$ or the reference level of the main sweep ramp waveform is applied. So all of the current through transistor 156 is quiescently conducted through transistor 152 and resistor 154 from the positive supply $+V$.

At time $T_0$, the main sweep terminates and initiates the holdoff period between main gating signals. As the main gate waveform B steps negative to turn off the electron beam 28, the first pickoff enable/inhibit waveform C at terminal 78' steps positive to enable constant current source transistor 136, and the waveform D at terminal 78" steps negative to cut off transistors 150, 152, and 156. While the voltage $\alpha V_1$ at terminal 84' and at the base of transistor 132 may be adjusted all the way from $V_0$ to $+V$. With the sweep terminated and the main sweep voltage stabilized at $V_0$, the base of transistor 132 is positive with respect to the base of transistor 130, thus transistor 132 is conduction and transistor 130 is off.

At time $T_1$, the main sweep is initiated and the ramp waveform A begins its linear rise toward +V. At the same time, main gate waveform B steps positive to turn on the electron beam 28. At time $T_2$, the linearly rising ramp waveform A passes through the reference level $\alpha V_1$, and comparator 72 switches, with transistor 130 now conducting and transistor 132 off. This switching action results in the negative-going edge of pickoff output waveform E at terminal 60' to initiate the delayed sweep and gate waveforms G and H respectively.

The delayed sweep duration is shown in FIG. 3 to be much shorter than the duration of the main sweep, and this is a normal phenomena in delayed sweep operation. The faster rate of the delayed sweep permits an expansion on the time scale of some event which appears narrow on the main sweep. The main gate waveform B and the delayed gate waveform H are algebraically added to provide the Z-axis signal I, where the main gate waveform turns on the electron beam to produce a display at normal intensity and the delayed gate waveform increases the electron beam current for the duration of the delayed sweep so that the time position of the delayed sweep appears on the main sweep display as an intensified segment. When the delayed sweep terminates at time $T_3$, the main sweep display returns to normal intensity and eventually terminates at time $T_4$, and waveform 48 begins to fall to its initial level $V_0$.

At time $T_5$, when the sweep waveform 48 falls through the reference level $\alpha V_1$, at the base of transistor 132, comparator 72 switches back to its quiescent state of transistor 132 conducting and transistor 130 off.

At time $T_6$ in FIG. 3, a second main sweep is initiated. The events occuring at times $T_6$, $T_7$, and $T_8$ are substantially the same as those occuring at times $T_1$, $T_2$, and $T_3$ respectively relative to the trigger pickoff circuit. However, it can be seen that the Z-axis signal I includes only the delayed gate waveform during the interval $T_6 - T_9$ because for this interval the delayed sweep waveform 66 is selected by the output switching circuit 24 to drive the horizontal deflection plates, and in accordance therewith the alternate logic passes only the delayed sweep gate waveform H to turn on the electron beam.

At time $T_9$, the main sweep terminates, and in simultaneity therewith, the pickoff enable/inhibit waveform C at terminal 78' steps negative to disable the constant current ransistor 136 of comparator 72 while the waveform D at terminal 78" steps positive to enable transistor 156 of comparator 74.

The events occuring from times $T_{10}$ through $T_{18}$ for the third and fourth main sweeps are substantially the same as those occuring from times $T_1$ through $T_9$ for the first and second main sweeps. The major difference is that comparator 74 chooses the delayed sweep starting point in accordance with the comparison level established by adjustment of potentiometer 90 to set the reference level $\alpha(V_1 + V_2)$.

Figure 4:
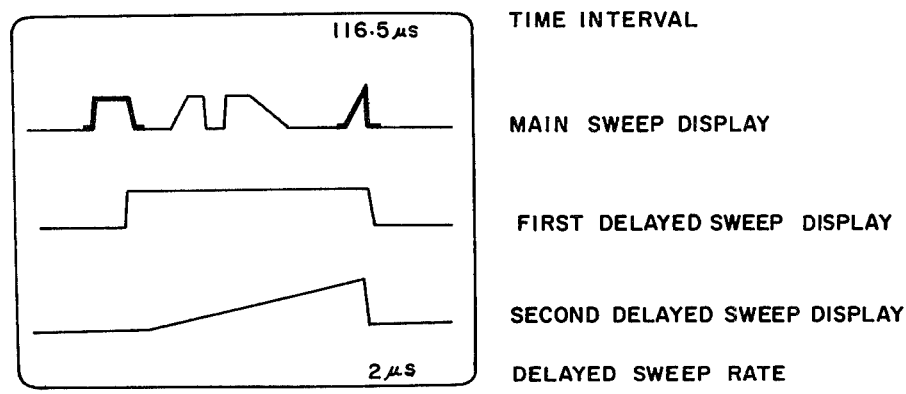
FIG. 4 is a typical oscilloscope display produced according to the present invention.

From the foregoing description, it can be discerned that the display alternates between the main and delayed sweeps in the following manner: first, a main sweep is displayed with the time position of a first delayed sweep appearing thereon as an intensified segment; second, the first delayed sweep is displayed; third, another main sweep is displayed with the time position of a second delayed sweep appearing thereon as an intensified segment; and fourth, the second delayed sweep is displayed. Thus, the alternating display may appear as shown in FIG. 4 wherein the main sweeps are super-positioned to appear as one sweep having two intensified portions, and the delayed sweeps are separated vertically to display first and second delayed events. The horizontal positions of the first and second delayed sweeps as shown is arbitrary and only for purposes of illustration. The first delayed sweep can be started at any point on the main sweep waveform depending upon the setting of potentiometer 80, and the width thereof may be adjusted by changing the sweep rate of the delayed sweep. The second delayed sweep may start from any point on the main sweep waveform between the initiation point of the first delayed sweep and the termination of the main sweep. This time is shown in the upper right corner of the display in FIG. 4. The rates of the two delayed sweeps is identical and is shown in the bottom right corner of the display, therefore the time relationship therebetween at any vertical grid line is the same and may be read out in alpha-numeric form as shown and as discussed previously in connection with digital voltmeter 110.

Figure 5:
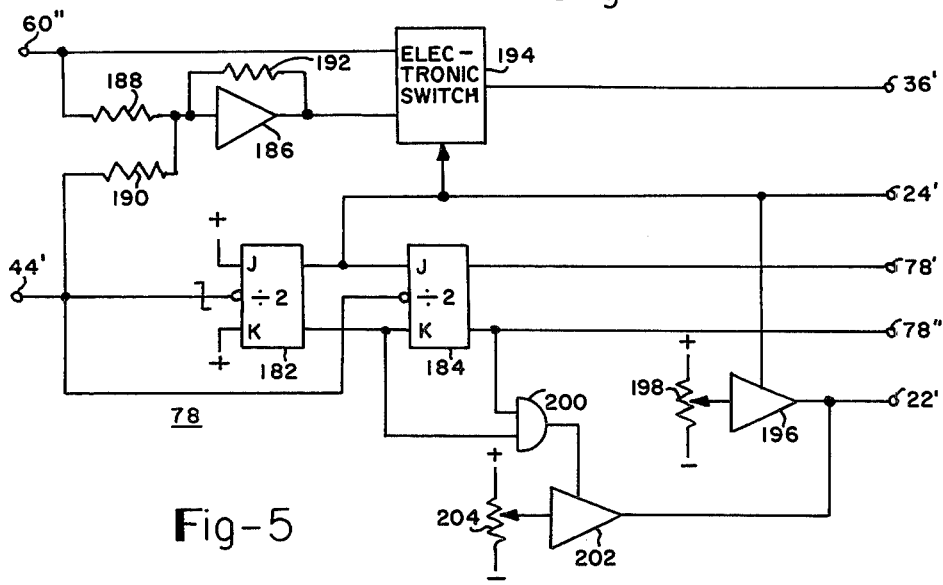
FIG. 5 is a detailed diagram of the alternate logic circuit.

The alternate logic circuit 78, which controls the display sequence described hereinabove, is shown in detail in FIG. 5. The main gate waveform is applied to terminal 44' and to the clock input of a J-K flip-flop 182, whose J and K inputs are connected to a positive voltage level. Thus flip-flop 182 is toggled when the negative edge of the main gate waveform is applied to input terminal 44'. The outputs of flip-flop 182 alternate from high to low as the negative edge of each main gate signal arrives, as shown by waveform K in FIG. 3. These outputs are applied to a second J-K flip-flop 184 where the alternating signal is again divided by a factor of two to produce the enable/inhibit signals at terminals 78' and 78" for the delay pickoff circuits 72 and 74 as previously described.

The delayed gate waveform is applied to input terminal 60". An operational amplifier 186 including resistors 188, 190, and 192 receives both the main and delayed gate waveforms and performs an algebraic addition thereof to effect the waveform I shown in FIG. 3. The alternating waveform from J-K flip-flop 182 is applied to an output terminal 24' and to electronic switch 194 to select between the added gates and the delayed gate to provide the proper signal for Z-axis amplifier 36 to correspond to the sweep driving signal selected by output switching circuit 24 connected to output terminal 24'.

The alternating waveform from flip-flop 182 is also utilized to enable an amplifier 196 every first and third sweep of the four-sweep cycle. A potentiometer 198, adjustable from the front panel of the oscilloscope, provides a selectable DC voltage at the input of amplifier 196 and is applied via output terminal 22' to vertical amplifier 22 in coincidence with the main sweep displays so that the main sweep may be offset vertically from the first delayed sweep, whose vertical position on the display is determined by the vertical positioning control of the vertical amplifier 22.

Similarly, the second delayed sweep display is offset from the first delayed sweep in the following manner. AND gate 200 produces a positive gate corresponding to every fourth main sweep and also corresponding to every second delayed sweep to enable amplifier 202. A potentiometer 204 provides a selectable DC voltage at the input of amplifier 202 and is applied via output terminal 22' to vertical amplifier 22 in coincidence with the second delayed sweep. As can be determined, the main, first delayed, and second delayed sweeps may be independently positioned using a single vertical amplifier, permitting the displays to be separated by any vertical amount or superimposed for precise time measurements.

Figure 6:
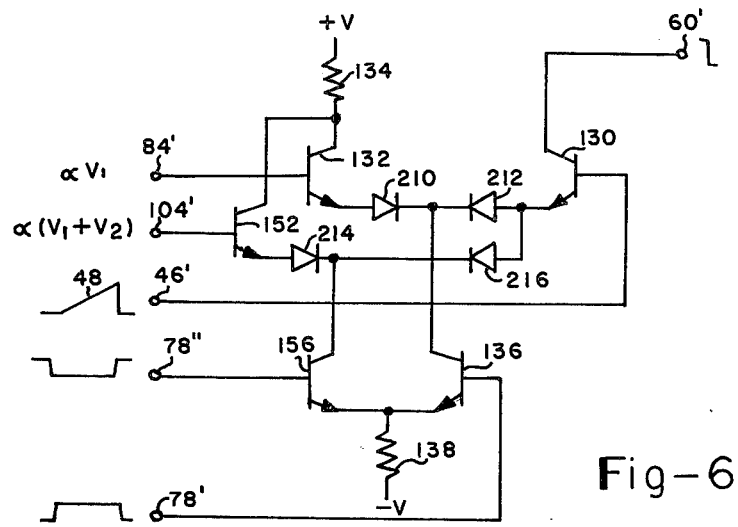
FIG. 6 is a detailed schematic of an alternative delay pickoff circuit.

FIG. 6 shows a detailed schematic of an alternative delayed pickoff circuit wherein components similar to those in FIG. 2 have the same reference numerals. In this circuit, the enable and inhibit waveforms are applied to terminals 78' and 78" to control the conduction state of the comparator comprising transistors 136 and 156 and resistor 138 as in the previous case. The main sweep waveform 48 is applied to terminal 46', and the reference levels are applied to terminals 84' and 104' as before. When transistor 136 is conducting, the pickoff comparator comprises transistors 130 and 132, and when transistor 156 is conducting, the pickoff comparator comprises transistor 130 and 152. In this manner, it can be seen that transistor 130 is common to both pickoff comparators, and the output signal is taken at terminal 60'. Diodes 210, 212, 214 and 216 ensure clean switching and complete turnoff of transistors 132 and 152 since the collectors of the current-source transistors 136 and 156 are allowed to float when not conducting.

Operation of the circuitry according to the present invention has been explained principally in connection with the described mode of operation wherein the delayed sweep waveform starts at one of a pair of selectable levels reached by the main sweep, and the delayed sweep waveform follows an independent sweep rate to provide a combination magnified display in which differential time measurements may easily be made. However, the same circuitry can be employed in other modes of operation, such as independent triggered single or dual-sweep operation.

While I have shown and described preferred embodiments of my invention, it will be apparent to those skilled in the art that many changes and modifications may be made without departing from my invention in its broader aspects. For example, rather than two delay pickoff comparators, one could be used wherein the reference voltages $\alpha V_1$ and $\alpha(V_1 + V_2)$ could be alternatively applied thereto; however, since short settling times would be required in such a scheme, additional circuitry would be necessary.

I claim:
1. In an oscilloscope for displaying an input waveform, said oscilloscope including a cathode-ray tube provided with deflection means, a dual delayed time base system comprising:

a first base generator triggered in time relation with said input waveform to produce a main sweep waveform, said first time base generator including means for adjusting the sweep rate of said main sweep waveform;

means for generating first and second selectable voltage levels;

comparator means for comparing said main sweep waveform to said first and second voltage levels so that first and second trigger pulses are generated in accordance therewith;

a second time base generator triggered in timed relation with said first and second trigger pulses to produce a delayed sweep waveform, said second time base generator including means for adjusting the sweep rate of said delayed sweep waveform; and logic circuit means for alternately enabling and inhibiting said first and second voltage levels so that said comparator means generates said first trigger pulse during the generation of a main sweep waveform and said second trigger pulse during the generation of the next succeeding main sweep waveform.

2. The system according to claim 1 wherein said means for generating first and second selectable voltage levels includes first and second potentiometer means and summing amplifier means wherein said first voltage level is proportional to a voltage selected by said first potentiometer means and said second voltage level is proportional to the sum of the voltages selected by said first and second potentiometer means.

3. The system according to claim 1 further including digital voltmeter means calibrated in units of time per volt, said voltmeter means selectively receiving said first selectable voltage level and the difference between said first and second selectable voltage levels and selectively providing a readout of the time intervals proportional thereto, said voltmeter means also being responsive to said means for adjusting the sweep rate of said main sweep waveform to provide voltmeter ranges corresponding to said sweep rate.

4. The system according to claim 1 wherein said logic circuit means includes means for causing a display presentation comprising a main sweep and a first and second delayed sweep wherein said main sweep and said second delayed sweep are separable vertically from said first delayed sweep, and main sweep having two intensified zones thereon at the relative time positions of said first and second delayed sweeps produced by the algebraic addition of Z-axis signals corresponding to each of said sweeps.

* * * * *